(12) United States Patent
Moriya

(10) Patent No.: US 12,068,366 B2
(45) Date of Patent: Aug. 20, 2024

(54) SEMICONDUCTOR DEVICE

(71) Applicant: FUJI ELECTRIC CO., LTD., Kawasaki (JP)

(72) Inventor: Tomohiro Moriya, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 398 days.

(21) Appl. No.: 17/587,753

(22) Filed: Jan. 28, 2022

(65) Prior Publication Data

US 2022/0320268 A1  Oct. 6, 2022

(30) Foreign Application Priority Data

Mar. 30, 2021  (JP) .................. 2021-058100

(51) Int. Cl.
| | |
|---|---|
| *H01L 29/78* | (2006.01) |
| *H01L 21/04* | (2006.01) |
| *H01L 21/76* | (2006.01) |
| *H01L 21/761* | (2006.01) |
| *H01L 29/06* | (2006.01) |

(Continued)

(52) U.S. Cl.
CPC ........ *H01L 29/063* (2013.01); *H01L 21/0465* (2013.01); *H01L 21/7602* (2013.01); *H01L 21/761* (2013.01); *H01L 29/0623* (2013.01); *H01L 29/1095* (2013.01); *H01L 29/1608* (2013.01); *H01L 29/66068* (2013.01); *H01L 29/7811* (2013.01); *H01L 29/7813* (2013.01)

(58) Field of Classification Search
CPC ............... H01L 29/063; H01L 21/0465; H01L 21/7602; H01L 21/761; H01L 29/0623; H01L 29/1095; H01L 29/1608; H01L 29/66068; H01L 29/7811; H01L 29/7813; H01L 29/0619; H01L 29/0638; H01L 29/0661; H01L 29/0878; H01L 29/2003

See application file for complete search history.

(56) References Cited

U.S. PATENT DOCUMENTS 9,825,164 B2  11/2017  Kagawa et al.
10,002,952 B2  6/2018  Sugahara et al.
(Continued)

FOREIGN PATENT DOCUMENTS

JP  2016-225455 A  12/2016
JP  6099749 B2  3/2017
(Continued)

*Primary Examiner* — Elias Ullah

(57) ABSTRACT

A semiconductor device includes n-type drift layer, n-type current spreading layer having higher impurity concentration than the drift layer, p-type base region provided on top surface, p-type gate-bottom protection region located in the current spreading layer, having first bottom edge portion formed of curved surface, p-type base-bottom embedded region in contact with bottom surface of the base region, having second bottom edge portion formed of curved surface on side surface facing the gate-bottom protection region, being separated from the gate-bottom protection region, and insulated gate electrode structure provided in trench penetrating through the base region to reach the gate-bottom protection region. Bottom surface of the base-bottom embedded region is deeper than bottom surface of the gate-bottom protection region, and minimum value of curvature radius of the first bottom edge portion is larger than minimum value of curvature radius of the second bottom edge portion.

8 Claims, 18 Drawing Sheets

(51) Int. Cl.
*H01L 29/10* (2006.01)
*H01L 29/16* (2006.01)
*H01L 29/66* (2006.01)

(56) References Cited

U.S. PATENT DOCUMENTS

| | | |
|---|---|---|
| 10,134,593 B2 | 11/2018 | Endo et al. |
| 10,199,493 B2 | 2/2019 | Kinoshita et al. |
| 10,403,749 B2 | 9/2019 | Kinoshita et al. |
| 10,964,809 B2 | 3/2021 | Noborio et al. |
| 2016/0190307 A1 | 6/2016 | Kagawa et al. |
| 2018/0033876 A1 | 2/2018 | Sugahara et al. |
| 2018/0151366 A1 | 5/2018 | Endo et al. |
| 2018/0197983 A1 | 7/2018 | Kinoshita et al. |
| 2019/0165166 A1 | 5/2019 | Kinoshita et al. |
| 2020/0227549 A1 | 7/2020 | Noborio et al. |

FOREIGN PATENT DOCUMENTS

| | | | |
|---|---|---|---|
| JP | 2019-054087 A | | 4/2019 |
| JP | 2019-071394 A | | 5/2019 |
| JP | 6617657 B2 | | 11/2019 |
| WO | 2017064949 A1 | | 4/2017 |

SEMICONDUCTOR DEVICE

CROSS REFERENCE TO RELATED APPLICATIONS

This application is based upon and claims the benefit of priority from the prior Japanese Patent Application No. 2021-58100 filed on Mar. 30, 2021, the entire contents of which are incorporated herein by reference.

BACKGROUND OF THE INVENTION

1. Field of the Invention

The present invention relates to a semiconductor device, and more particularly to a highly reliable trench-gate semiconductor device.

2. Description of the Related Art

Conventionally, silicon (Si) semiconductors are used in power semiconductor devices mainly used for power conversion devices and the like. In recent years, silicon carbide (SiC), which is a wide-gap semiconductor, is a promising semiconductor material to replace Si. SiC semiconductor devices have several advantages over the conventional Si semiconductor devices, including the ability to reduce the resistance of the device in the on-state by a factor of several hundreds, and the ability to be used in a higher temperature environment, for example, 200° C. or higher. Such advantages are given by the properties of the SiC material itself in that the band gap of SiC is about 3 times larger than that of Si and the dielectric-breakdown field strength is about ten times larger than that of Si.

As power semiconductor devices, Schottky barrier diodes (SBDs), field effect transistors (FETs), static induction transistors (SITs), insulated gate bipolar transistors (IGBTs) and the like have been commercialized. A trench-gate MOSFET is a semiconductor device having a three-dimensional structure in which a trench is formed in a SiC semiconductor substrate and the sidewall of the trench is used as a channel. Therefore, when compared between the devices having the same on-resistance, the trench-gate MOSFET is considered to be a particularly promising semiconductor device structure because the device area of the trench-gate MOSFET can be much smaller than that of the planar vertical MOSFET.

In the conventional trench-gate MOSFET, the channel is provided in the vertical direction along the sidewall of the trench formed in the SiC semiconductor layer, and thus, the entire inner wall of the trench is covered with the gate insulating film. Since the dielectric-breakdown field strength of SiC is about 10 times higher than that of Si, the dielectric breakdown does not occur in the SiC semiconductor layer when a high voltage is applied, and a high electric field is also applied to the gate insulating film provided on the inner wall of the trench. In particular, the electric field tends to concentrate on the bottom of the trench facing the drain electrode, and the dielectric breakdown of the gate insulating film easily occurs. In order to improve the reliability of the trench-gate MOSFET, an electric field relaxation structure that mitigates the electric field concentration at the bottom of the trench to prevent breakdown of the gate insulating film is required. As the electric field relaxation structure mitigating the electric field concentration at the bottom of the trench, the $p^+$-type base-bottom embedded region in the n-type current spreading layer (CSL) formed around the trench and the $p^+$-type gate-bottom protection region in contact with the bottom of the gate is selectively provided.

WO2017/064949A proposes a structure in which the base-bottom embedded region is formed deeper toward the drain region side than the gate-bottom protection region. In the structure of WO2017/064949A, the p-n junction in the base-bottom embedded region has a higher electric field strength than the p-n junction in the gate-bottom protection region. As a result, carrier injection into the gate insulating film may be prevented by generating the avalanche breakdown in the base-bottom embedded region.

In JP6617657B, it is described that the n-type embedded layer having a higher impurity concentration than the n-type impurity doped layer directly below the gate-bottom protection region is formed in contact with the bottom surface of the base-bottom embedded region. The electric field strength applied to the p-n junction between the n-type embedded layer of the higher impurity concentration and the base-bottom embedded region is higher than the p-n junction between the n-type impurity doped layer and the gate-bottom protection region. Therefore, avalanche breakdown tends to occur in the base-bottom embedded region rather than in the gate-bottom protection region, thereby preventing avalanche current from flowing into the gate insulating film.

However, in WO2017/064949A and JP66176572B, because both of the base-bottom embedded region and the gate-bottom protection region are formed in the same shape, the electric field tends to concentrate to the corners of the base-bottom embedded region and the gate-bottom protection region, respectively. Therefore, the electric field strength may reach a level sufficient for avalanche breakdown to occur at the corners of the gate-bottom protection region. When the avalanche breakdown occurs at the p-n junction in the gate-bottom protection region, carriers may be injected into the gate insulating film inside the trench, resulting in dielectric breakdown of the gate insulating film.

SUMMARY OF THE INVENTION

An aspect of the present invention inheres in a semiconductor device, including: (a) a drift layer of a first conductivity type made of a hexagonal semiconductor having a wider bandgap than silicon; (b) a current spreading layer of the first conductivity type disposed on a top surface of the drift layer, having a higher impurity concentration than the drift layer; (c) a base region of a second conductivity type disposed on a top surface of the current spreading layer; (d) a gate-bottom protection region of the second conductivity type located in the current spreading layer, having a first bottom edge portion formed of a curved surface; (e) a base-bottom embedded region of the second conductivity type in contact with a bottom surface of the base region while being separated from the gate-bottom protection region in the current spreading layer, the base-bottom embedded region having a second bottom edge portion formed of a curved surface on a side surface facing the gate-bottom protection region; and (f) an insulated-gate electrode structure provided in a trench penetrating the base region to reach the gate-bottom protection region, wherein in a cross section perpendicularly cut to an extending direction of the trench, a bottom surface of the base-bottom embedded region is placed deeper than a bottom surface of the gate-bottom protection region, and a minimum value of a curvature radius of the first bottom edge portion is larger than a minimum value of a curvature radius of the second bottom edge portion.

DETAILED DESCRIPTION

Figure 1:
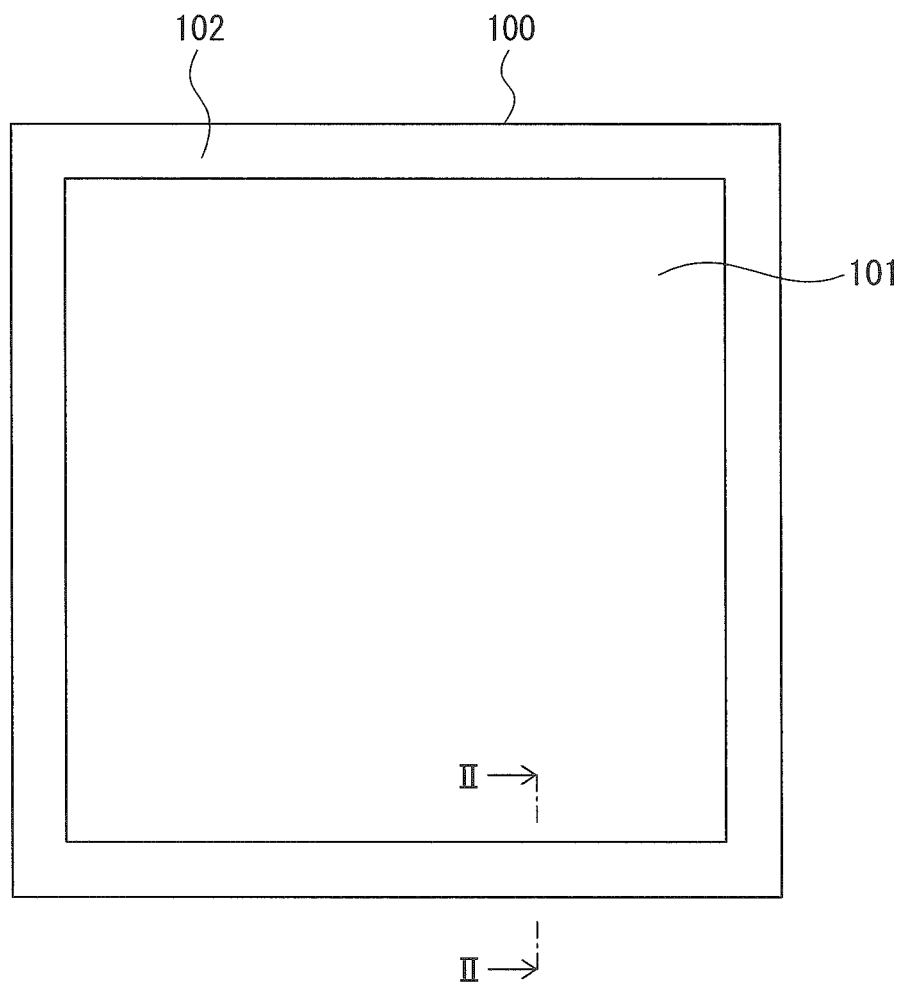
FIG. 1 is a schematic plan view illustrating an example of a semiconductor device according to an embodiment of the present invention.

Hereinafter, embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the present specification, the source region of the MOS transistor is the "one main region (first main region)" that can be selected as the emitter region of the insulated gate bipolar transistor (IGBT). Further, in a thyristor such as a MOS-controlled electrostatic induction thyristor (SI thyristor), one main region can be selected as a cathode region. The drain region of the MOS transistor is the "other main region (second main region)" of the semiconductor device, which can be selected as the collector region in the IGBT and the anode region in the thyristor. As used herein, the term "main region" means either the first main region or the second main region, which is appropriate from the common general technical knowledge of those skilled in the art.

Further, in the following descriptions, the terms relating to directions, such as "top and bottom" are merely defined for illustration purposes, and thus, such definitions do not limit the technical spirit of the present invention. Therefore, for example, when the paper plane is rotated by 90 degrees, the "top and bottom" are read in exchange to the "left and right". When the paper plane is rotated by 180 degrees, the "top" is changed to the "bottom", and the "bottom" is changed to the "top". Further, in the following description, the case where a first conductivity type is n-type and a second conductivity type is p-type will be exemplarily described. However, it is also possible to select the conductivity type in an inverse relationship so that the first conductivity type is p-type and the second conductivity type is n-type. Further, the superscript "+" or "−" added to the mark "n" or "p" denotes that a semiconductor region has relatively high or low impurity concentration than a region without the superscript "+" or "−" added. It should be noted that semiconductor regions denoted by the same mark, such as "n", do not necessarily have exactly the same impurity concentration.

<Structure of Semiconductor Device>

Figure 2:
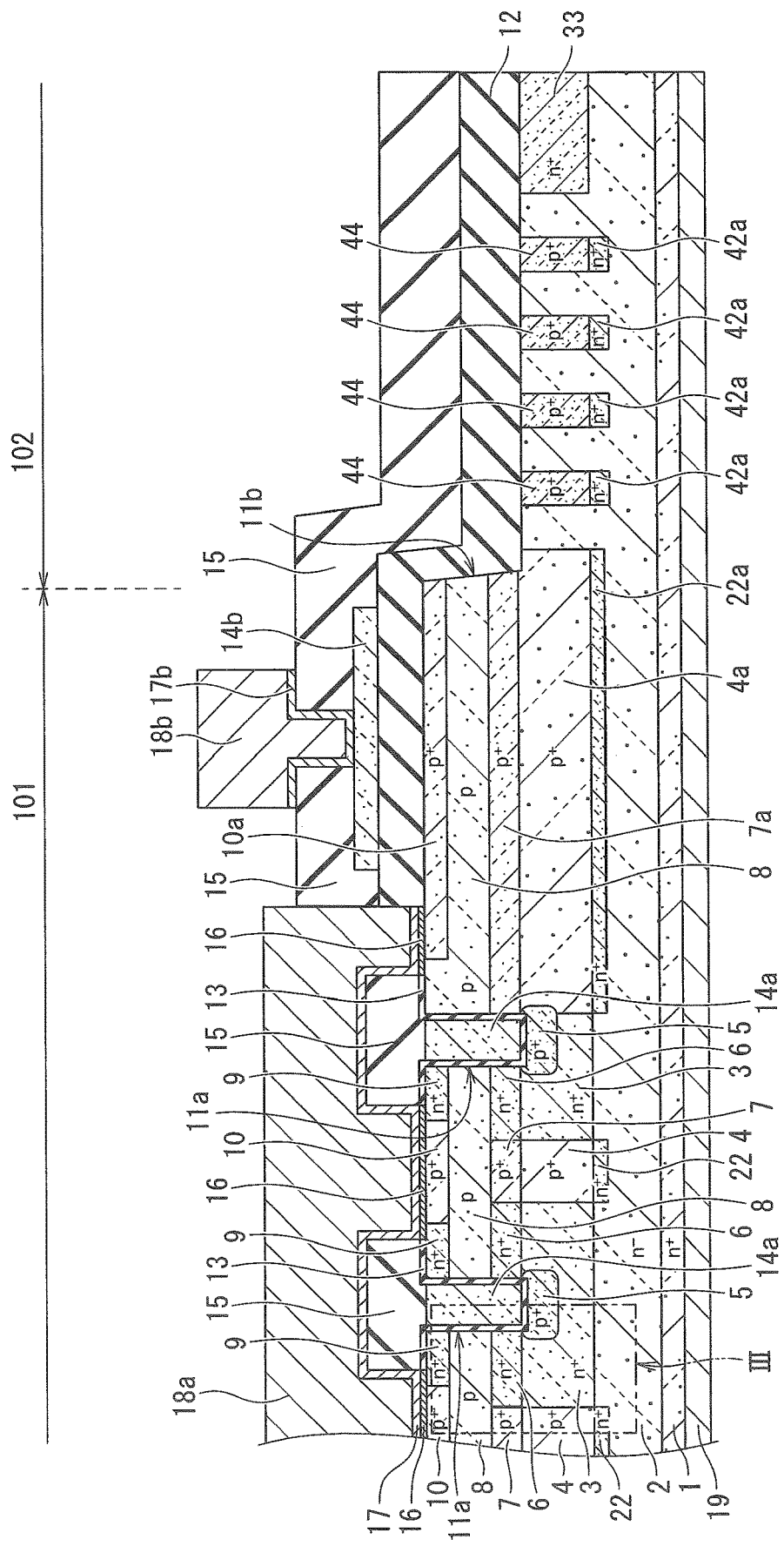
FIG. 2 is a schematic cross-sectional view taken along the line II-II in FIG. 1.

As illustrated in FIG. 1, an SiC semiconductor device (semiconductor chip) 100 according to an embodiment of the present invention includes an active area 101 and an outer-edge area 102. For example, the active area 101 has a rectangular planar shape, and the outer-edge area 102 is arranged around the active area 101 so as to surround the active area 101. FIG. 2 is a cross-sectional view taken along the line II-II in FIG. 1. As illustrated in FIG. 2, the active area 101 includes an active element and the outer-edge area 102 includes an edge-termination structure. FIG. 2 illustrates a case including a MOSFET having a trench-gate structure provided on a first conductivity type ($n^-$-type) drift layer 2 as the active element, and a plurality of electric-field relaxation regions (guard rings) 6a as the edge-termination structure. A trench 11a having a stripe shape extends in a direction perpendicular to the paper plane.

As illustrated in FIG. 2, a second conductivity type (p-type) base region 8 is arranged on a top surface of the drift layer 2. The drift layer 2 and the base region 8 are provided with epitaxial growth layers (hereinafter, referred to as "epitaxial layers") made of SiC. A p$^+$-type base contact region 10 having a higher impurity concentration than the base region 8 is selectively provided on an upper portion of the base region 8. An n$^+$-type first main region (source region) 7 having a higher impurity concentration than the drift layer 2 is selectively formed on the upper portion of the base region 8 so as to be in contact with the base contact region 10.

A trench 11a having a width of 1 μm or less is formed to penetrate the base region 8 from the top surfaces of the source region 9 and the base region 8. The source region 9 and the base region 8 are in contact with an outer side of the trench 11a. A bottom surface and a sidewall in the trench 9 are lined with a gate insulating film 13. A gate electrode 14a is embedded in the trench 9 via the gate insulating film 13 to form an insulated-gate electrode structure (13, 14a). For the gate insulating film 13, in addition to a silicon oxide (SiO$_2$) film, a dielectric film, such as a silicon oxynitride (SiON) film, a strontium oxide (SrO) film, a silicon nitride (Si$_3$N$_4$) film, an aluminum oxide (Al$_2$O$_3$) film, a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, and a bismuth oxide (Bi$_2$O$_3$) film, may be adopted. Moreover, a single-layer film of any one of the above-mentioned dielectric films or a composite film in which the plural dielectric films are laminated, may be used. For a material of the gate electrode 14a, for example, a polysilicon layer doped with impurities, such as phosphorus (P), boron (B) and the like, at a high concentration, that is a doped polysilicon layer, may be used.

An n-type current spreading layer (CSL) (3, 6) having a higher impurity concentration than the drift layer 2 is selectively formed on an upper portion of the drift layer 2. The current spreading layer (3, 6) is provided with a first spreading layer 3 and a second spreading layer 6. The first spreading layer 3 has a bottom surface in contact with the drift layer 2. The second spreading layer 6 contacts a top surface of the first spreading layer 3 and a bottom surface of the base region 8 and contacts the side surface of the trench 11a. The bottom of the trench 11a reaches the current spreading layer (3, 6). The current spreading layer (3, 6) does not necessarily have to be formed. When the current spreading layer (3, 6) is not formed, the bottom of the trench 11a reaches the drift layer 2. A p$^+$-type gate-bottom protection region 5 is located in the first spreading layer 3 to be in contact with the bottom of the trench 11a. In the first spreading layer 3 below the base contact region 10, a p$^+$-type first embedded region 4 is located deeper than the gate-bottom protection region 5 and separated from the gate-bottom protection region 5. In the second spreading layer 6 below the base contact region 10, a p$^+$-type second embedded region 7 is located in contact with a top surface of the first embedded region 4 and a bottom surface of the base region 8. The first embedded region 4 and the second embedded region 7 implement a base-bottom embedded region (4, 7). The gate-bottom protection region 5 has a higher impurity concentration than the first embedded region 4 in the base-bottom embedded region (4, 7).

An interlayer insulating film 15 is arranged on a top surface of the gate electrode 14a. For the interlayer insulating film 15, a silicon oxide film which includes additives of both boron (B) and phosphorus (P), that is BPSG, may be used. However, a silicon oxide film which includes the additive of phosphorus (P), that is PSG, a non-doped SiO$_2$ film called "NSG" that does not include any additives of phosphorus (P) and boron (B), a silicon oxide film which includes the additive of boron (B), that is BSG, an Si$_3$N$_4$ film and the like, may be used for the interlayer insulating film 15. Alternatively, a composite film in which the above-mentioned films are laminated may be adopted.

As illustrated in FIG. 2, a source contact layer 16 is formed to physically contact the source region 9 and the base contact region 10 which are exposed in the interlayer insulating film 15. A barrier metal layer 17 is disposed to cover the interlayer insulating film 15 and the source contact layer 16. A first main electrode (source electrode) 18a is electrically connected to the source region 9 and the base contact region 10 via the barrier metal layer 17 and the source contact layer 16. For example, a nickel silicide (NiSi$_x$) film may be used for the source contact layer 16, and a titanium nitride (TiN) film or a titanium (Ti) film may be used for the barrier metal layer 17. An aluminum (Al) film or an aluminum-silicon (Al—Si) film may be used for the source electrode 18a. The source electrode 18a is arranged separately from a gate surface electrode (not illustrated).

In the active area 101 near the outer-edge area 102, as illustrated in FIG. 2, a base contact area 10a is formed in an upper portion of the base region 8. An interconnection layer 14b is disposed on a top surface of the base contact region 10a via a field oxide film 12, and a gate electrode pad 18b is disposed on a top surface of the interconnection layer 14b via a barrier metal layer 17b. Although not shown, the gate electrode pad 18b is electrically connected to the gate electrode 14a via the interconnection layer 14b. The interlayer insulating film 15 and the field oxide film 12 extend from the vicinity of the boundary of the active area 101 and the outer-edge area 102 to a bottom of a mesa groove 11b in the outer-edge area 102. In the active area 101 near the outer-edge area 102, the base-bottom embedded region (4a, 7a) is formed to contact the bottom surface of the base region 8. The base-bottom embedded region (4a, 7a) is provided with a second embedded region 7a having a top surface contacting the bottom surface of the base region 8 and a first embedded region 4a having a bottom surface contacting a local current spreading layer 22a.

As illustrated in FIG. 2, in the outer-edge area 102, a plurality of p$^+$-type guard rings 44 are disposed in an upper portion of the drift layer 2 exposed at the bottom of the mesa groove 11b. The guard rings 44 function as an electric-field relaxation region and each of the guard rings 44 is formed in a concentric ring shape spaced apart from each other to surround the active area 101. In the drift layer 2, each of the guard rings 44 has a bottom surface at the same level as the bottom surfaces of the first embedded regions 4a in the base-bottom embedded regions (4a, 7a) and is provided with the same impurity concentration as the first embedded regions 4a. A plurality of local current spreading layers 42a of n$^+$-type are formed on respective bottom surfaces of the guard rings 44. Each of the local current spreading layers 42a is at the same level and with the same impurity concentration as the local current spreading layers 22, 22a.

In an outer end of the outer-edge area 102, an n$^+$-type channel stopper 33 is formed in a concentric ring shape in the upper portion of the drift layer 2. Instead of the n+-type channel stopper 33, a p+-type channel stopper may be formed.

An n+-type second main region (drain region) 1 is arranged on a bottom surface of the drift layer 2. A second main electrode (drain electrode) 19 is arranged on a bottom surface of the drain region 1. For the drain electrode 19, for example, a single-layer film made of gold (Au) or a metal film in which Ti, nickel (Ni), and Au are laminated in this order may be used, and further a metal film, such as molybdenum (Mo), tungsten (W) and the like, may be laminated as the lowermost layer of the drain electrode 19. Further, a drain contact layer may be formed between the drain region 1 and the drain electrode 19. For the drain contact layer, for example, a nickel silicide (NiSi$_x$) film may be used.

For example, the drift layer 2 has the impurity concentration of $2 \times 10^{15}$ cm$^{-3}$ or more and $2 \times 10^{16}$ cm$^{-3}$ or less, and the base region 8 has the impurity concentration of $1 \times 10^{17}$ cm$^{-3}$ or more and $1 \times 10^{18}$ cm$^{-3}$ or less. The base contact region 10 has the impurity concentration of $5 \times 10^{18}$ cm$^{-3}$ or more and $5 \times 10^{20}$ cm$^{-3}$ or less, and the source region 9 has $5 \times 10^{18}$ cm$^{-3}$ or more and $5 \times 10^{20}$ cm$^{-3}$ or less. The current spreading layer (3, 6) has the impurity concentration of $5 \times 10^{16}$ cm$^{-3}$ or more and $5 \times 10^{17}$ cm$^{-3}$ or less, and the local current spreading layer 22 has the impurity concentration of $5 \times 10^{17}$ cm$^{-3}$ or more and $5 \times 10^{18}$ cm$^{-3}$ or less. The impurity concentration of the gate-bottom protection region 5 is higher than the first embedded region 4 in the base-bottom embedded region (4, 7), and is larger than $1 \times 10^{17}$ cm$^{-3}$ and $1 \times 10^{19}$ cm$^{-3}$ or less, preferably $3 \times 10^{18}$ cm$^{-3}$ or more and $1 \times 10^{19}$ cm$^{-3}$ or less. The first embedded region 4 in the base-bottom embedded region (4, 7) and the guard rings 44 have the same impurity concentration of $1 \times 10^{17}$ cm$^{-3}$ and $3 \times 10^{18}$ cm$^{-3}$ or less. The second embedded region 7 in the base-bottom embedded region (4, 7) has about the same impurity concentration as the first embedded region 4, but may have the higher impurity concentration than the first embedded region 4. The drain region 1 has the impurity concentration of $1 \times 10^{18}$ cm$^{-3}$ or more and $1 \times 10^{19}$ cm$^{-3}$ or less.

In the semiconductor device according to the embodiment, a structure having the drain region 1 implemented by the semiconductor substrate made of SiC (the SiC substrate) and the drift layer 2 implemented by the epitaxial layer made of SiC (the SiC layer) is exemplified. The semiconductor regions implementing the semiconductor device according to the embodiment which include the drain region 1 and the drift layer 2 is not limited to SiC. In addition to SiC, a hexagonal semiconductor material having the forbidden bandgap wider than 1.1 eV of Si, such as gallium nitride (GaN), lonsdaleite (hexagonal diamond), aluminum nitride (AlN) and the like, may be used. As for values of the forbidden bandgaps at room temperature, 3.26 eV for 4H-SiC, 3.02 eV for 6H-SiC, 3.4 eV for GaN, 5.5 eV for diamond and 6.2 eV for AlN, are reported respectively. In the present invention, a semiconductor having a forbidden bandgap larger than that of silicon may be defined as a wide bandgap semiconductor.

During operation of the semiconductor device according to the embodiment, a positive voltage is applied to the drain electrode 19 with the source electrode 18a as the ground potential and a positive voltage equal to or higher than the threshold value is applied to the gate electrode 14a. Thus, an inversion layer (a channel) is induced in the base region 8 at the sidewall of the trench 11a to turn on the semiconductor device. The inversion layer is formed in the region of the base region 8 in contact with the sidewall of the trench 11a as an interface between the gate insulating film 13 and the base region 8 where the base region 8 faces the gate electrode 14a. In the on-state, an electric current flows from the drain electrode 19 to the source electrode 18a via the drain region 1, the drift layer 2, the current spreading layer (3, 6), the inversion layer in the base region 8, and the source region 9. On the other hand, when the voltage applied to the gate electrode 14a is less than the threshold value, the inversion layer is not induced in the base region 8. Thus, the semiconductor device is turned off and no electric current flows from the drain electrode 19 to the source electrode 18a.

Figure 3:
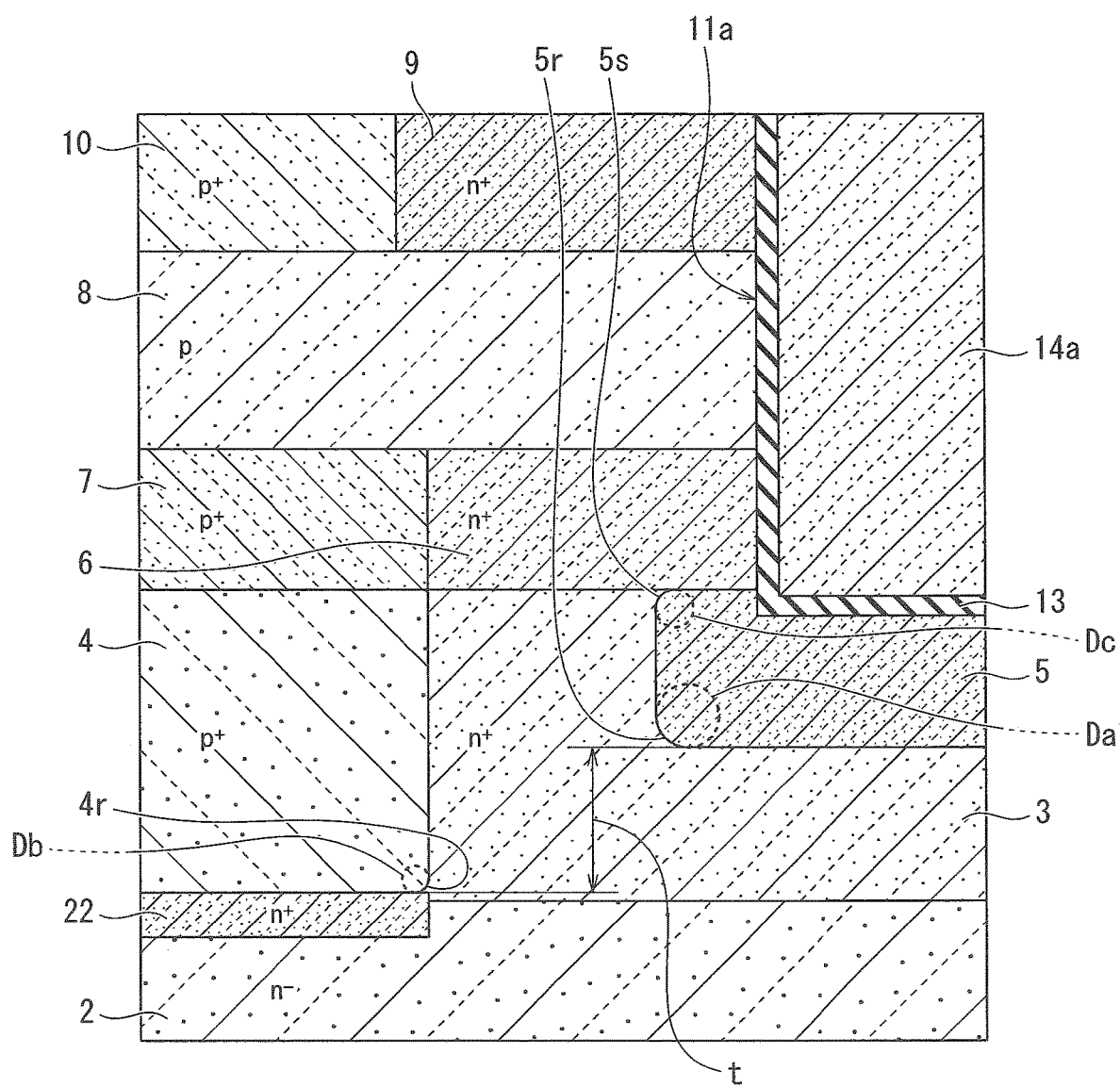
FIG. 3 is an enlarged view of portion III in FIG. 2.

FIG. 3 is an enlarged view of part III in FIG. 1. As illustrated in FIG. 3, the gate-bottom protection region 5 is formed in the first spreading layer 3 in the current spreading layer (3, 6). A bottom edge portion (first bottom edge portion) 5r and a top edge portion 5s on the gate-bottom protection region 5 are formed of curved surfaces, respectively. A bottom edge portion (second bottom edge portion) 4r of the first embedded region 4 in the base-bottom embedded region (4, 7) is also formed of a curved surface. In a cross section cut perpendicular to an extending direction of the trench 11a, a circle having the smallest radius of curvature among arcs approximating the curved surface of the bottom edge portion 5r on the gate-bottom protection region 5 is defined as a curvature circle Da, and a circle having the smallest radius of curvature among arcs approximating the curved surface of the top edge portion 5s on the gate-bottom protection region 5 is defined as a curvature circle Dc. Similarly, a circle having the smallest radius of curvature among arcs approximating the curved surface at the bottom edge portion 4r on the base-bottom embedded region (4, 7) is defined as a curvature circle Db. The minimum value of the curvature radius of the curvature circle Da at the bottom edge portion 5r on the gate-bottom protection region 5 is larger than the minimum value of the curvature radius of the curvature circle Db at the bottom edge portion 4r on the first embedded region 4 in the base-bottom embedded region (4, 7). Thus, the electric field is easily concentrated at the bottom edge portion 4r on the base-bottom embedded region (4, 7). Therefore, avalanche breakdown is more likely to occur on the base-bottom embedded region (4, 7) rather than the gate-bottom protection region 5, and it is possible to prevent avalanche current from flowing into the gate insulating film 13 in the trench 11a. Further, the minimum value of the curvature radius of the curvature circle Dc at the top edge portion 5s on the gate-bottom protection region 5 is desirably larger than the minimum value of the curvature radius of the curvature circle Db at the bottom edge portion 4r on the base-bottom embedded region (4, 7). As a result, the electric field crowding in the vicinity of the gate-bottom protection region 5 can be further mitigated, and avalanche breakdown in the vicinity of the gate-bottom protection region 5 can be avoided.

Figure 4:
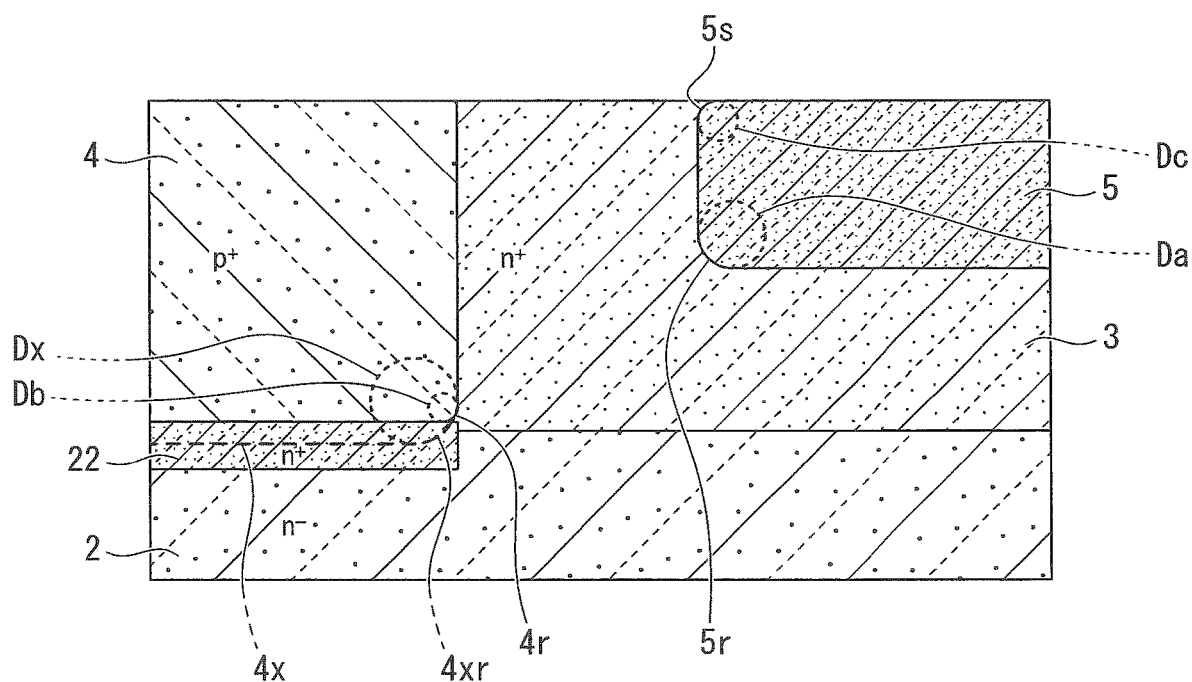
FIG. 4 is a schematic cross-sectional view illustrating an example of a method of decreasing a curvature radius on a bottom corner of the base-bottom embedded region illustrated in FIG. 3.

The gate-bottom protection region 5 and the first embedded region 4 of the base-bottom embedded region (4, 7) are formed by implanting p-type impurity ions into the n-type current spreading layer (3, 6) using ion-implantation technology, as described below. Since the impurity diffusion coefficient in SiC is very small, the impurity concentration distribution can be accurately and reproducibly controlled. The penetration depth of the implanted ions is determined by the acceleration energy and the loss of momentum due to collisional scattering with the crystal lattice of the semiconductor layer, and varies according to a Gaussian distribution. In general, the deeper the ion implantation depth, the larger the variation in the depth distribution of the implanted ions. FIG. 4 is a schematic cross-sectional view illustrating an example of fabrication method of the gate-bottom protection region 5 and the first embedded region 4 of the base-bottom embedded region (4, 7) by implantation of p-type impurity ions into the first spreading layer 3 of the current spreading layer (3, 6). An implanted region 4x illustrated in FIG. 4 is a region in which the p-type impurity ions implanted from the top surface of the first spreading layer 3, aiming at the level of the bottom surface of the first embedded region 4, are distributed further downward from the bottom surface of the first embedded region 4. As illustrated in FIG. 3, the level of the bottom surface of the first embedded region 4 is deeper by a depth t than the bottom surface of the gate-bottom protection region 5, and the variation of the distribution of implanted ions in the implanted region 4x may increase. Thus, the minimum value of the curvature radius of the curvature circle Dx at the bottom edge portion 4xr on the implanted region 4x may be larger than the minimum value of the curvature radius of the curvature circle Da at the bottom edge portion 5r on the gate-bottom protection region 5. Therefore, before forming the first embedded region 4, n-type impurity ions are implanted in the position overlapping the implanted region 4x to form the n$^+$-type local current spreading layer 22 having a higher impurity concentration than the implanted region 4x. As a result, the p-type impurities in the implanted region 4x may be compensated by the n-type impurities in the local current spreading layer 22, and the minimum value of the curvature radius of the curvature circle Db at the bottom edge portion 4r on the first embedded region 4 can be made smaller than the minimum value of the curvature radius of the curvature circle Da at the bottom edge portion 5r on the gate-bottom protection region 5. In addition, after forming the first embedded region 4 and the implanted region 4x, the n$^+$-type local current spreading layer 22 having a higher impurity concentration than the implanted region 4x may be formed to overlap the implanted region 4x.

Further, as illustrated in FIG. 3, the bottom surface of the first embedded region 4 in the base-bottom embedded region (4, 7) is placed at a level deeper by a depth t than the bottom surface of the gate-bottom protection region 5. Thus, during operation of the semiconductor device according to the embodiment, the electric field is more easily concentrated on the base-bottom embedded region (4, 7), and the electric field crowding on the gate-bottom protection region 5 can be mitigated. In addition, the depth t may be set to zero, that is, the bottom of the first embedded region 4 may be set to the same depth as the bottom of the gate-bottom protection region 5. Here, the same depth denotes a depth including a manufacturing variation, and may include variation of ±100 nm. Even in such case, the same effectiveness can be obtained because the electric field is concentrated in the first embedded region 4 having a smaller curvature radius.

Figure 5:
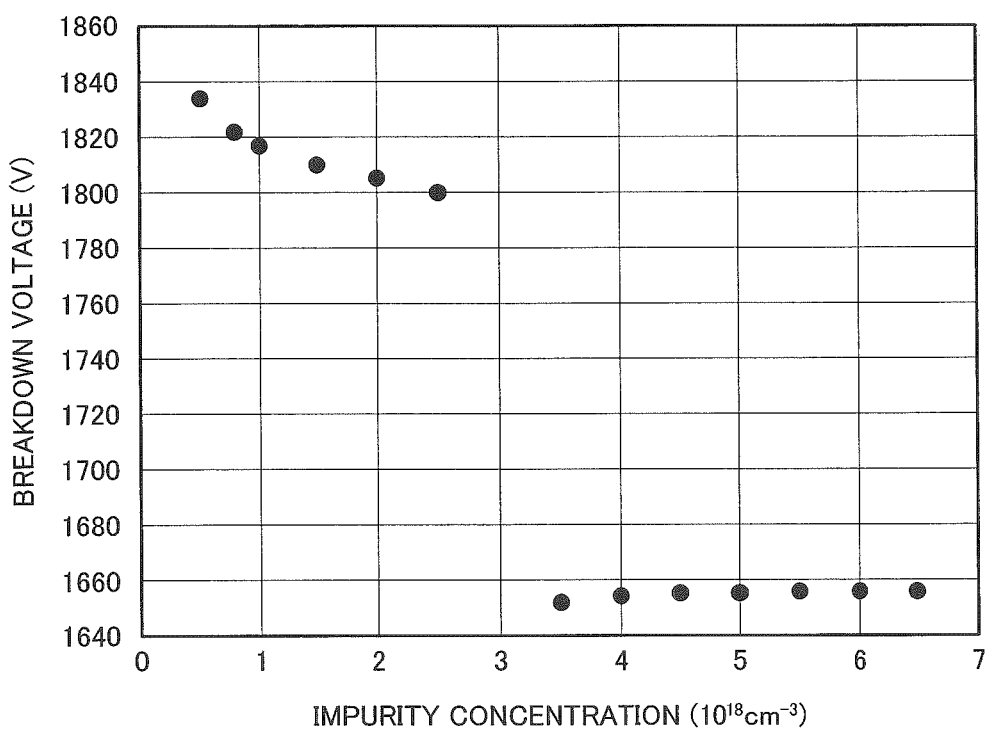
FIG. 5 is a diagram illustrating a relationship between the impurity concentration of the guard ring and the breakdown voltage of the outer-edge area.

In the semiconductor device according to the embodiment illustrated in FIG. 2, if the p-type impurity concentration of the gate-bottom protection region 5 is low, the relaxation effectiveness against the electric field crowding may be reduced and the dielectric breakdown of the gate insulating film 13 may not be prevented. In addition, if the p-type impurity concentration of the guard ring 44 is too high, the breakdown voltage at the outer-edge area 102 will be decreased. FIG. 5 illustrates a relationship of breakdown voltages of p-n diodes, for example, corresponding to the p-n junction by the guard ring 44 and the drift layer 2, to p-type impurity concentrations of semiconductor layers corresponding to the guard ring 44. As illustrated in FIG. 5, when the p-type impurity concentration is less than $3\times10^{18}$ cm$^{-3}$, the breakdown voltage of the diode can be ensured at about 1800 V or higher, but when the p-type impurity concentration is $3\times10^{18}$ cm$^{-3}$ or more, the breakdown voltage of the diode is decreased to about 1660V or lower. Therefore, in order to mitigate the electric field crowding near the trench 11a, the p-type impurity concentration of the gate-bottom protection region 5 should be $3\times10^{18}$ cm$^{-3}$ or more and $1\times10^{19}$ cm$^{-3}$ or less. Furthermore, in order to prevent the reduction of breakdown voltage in the outer-edge area 102, the impurity concentration of the first embedded region 4 of the base-bottom embedded region (4, 7) and the guard rings 44 shall be $1\times10^{17}$ cm$^{-3}$ or more and less than $3\times10^{18}$ cm$^{-3}$.

Thus, in the embodiment, the minimum value of the curvature radius of the curvature circle Da at the bottom edge portion 5r on the gate-bottom protection region 5 is larger than the minimum value of the curvature radius of the curvature circle Db at the bottom edge portion 4r on the first embedded region 4 in the base-bottom embedded region (4, 7). Moreover, the bottom surface of the first embedded region 4 is placed at a level deeper than the bottom surface of the gate-bottom protection region 5 by a depth t. As a result, the electric field crowding on the gate-bottom protection region 5 can be mitigated by concentrating the electric field to the base-bottom embedded region (4, 7), and avalanche breakdown can be avoided from occurring in the vicinity of the gate-bottom protection region 5.

<Manufacturing Method of Semiconductor Device>

Next, a manufacturing method of the SiC semiconductor device according to the embodiment will be given by taking a trench-gate MOSFET as an example, with reference to the cross-sectional views of FIGS. 6 to 18. Note that the manufacturing method of the trench-gate MOSFET described below is merely an example and may be achieved by various other manufacturing methods including a modification as long as the gist described in the claims is included.

Figure 6:
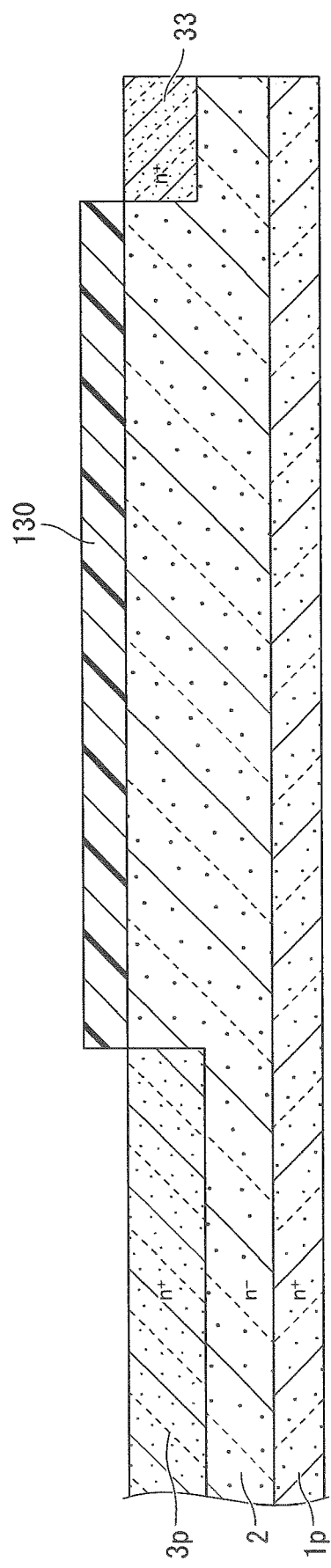
FIG. 6 is a schematic cross-sectional view illustrating an example of a process in a manufacturing method of the semiconductor device according to the embodiment of the present invention.

First, an n$^+$-type SiC semiconductor substrate (a substrate) 1p in which n-type impurities such as nitrogen (N) are doped, is prepared. An n-type epitaxial layer is grown on a top surface of the substrate 1p. Next, using a photoresist pattern 130 delineated on a top surface of the epitaxial layer as an ion implantation mask, n-type impurity ions, such as nitrogen (N) and the like, are selectively implanted into the epitaxial layer from an upper side of the epitaxial layer by multiple-energy ion implantation. Thus, as illustrated in FIG. 6, an n$^+$-type implanted layer 3p is formed on the upper portion of the drift layer 2 provided with the epitaxial layer in the active area 101 of the semiconductor chip 100 illustrated in FIG. 1, and the n$^+$-type channel stopper 33 is formed in the outer-edge area 102.

Figure 7:
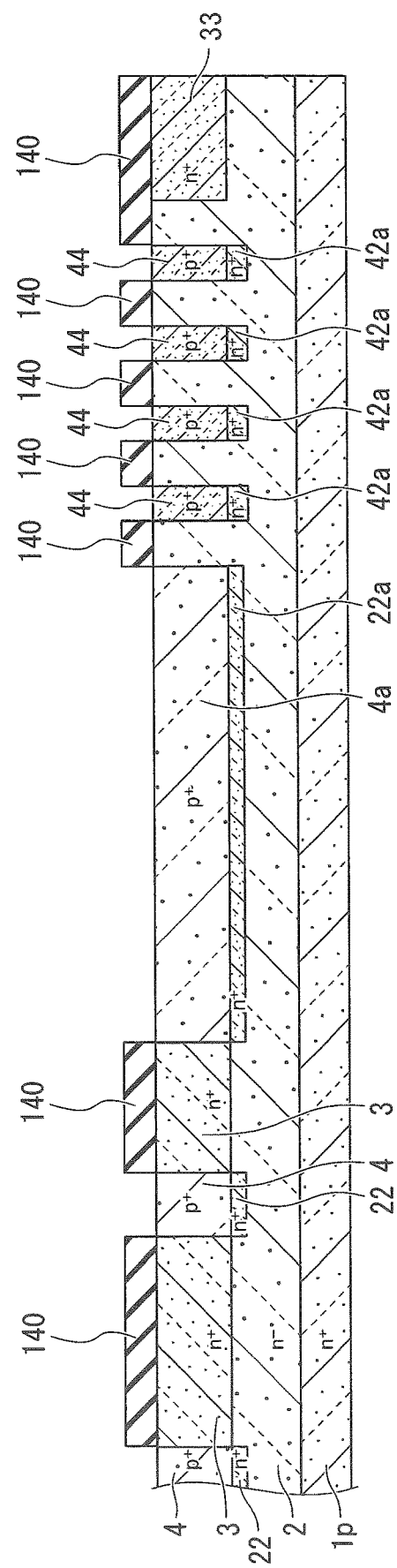
FIG. 7 is a schematic cross-sectional view illustrating an example of a process following FIG. 6 in the manufacturing method of the semiconductor device according to the embodiment of the present invention.

An oxide film made of SiO$_2$ is deposited on top surfaces of the implanted layer 3p and the channel stopper 33 by chemical vapor deposition (CVD) technology and the like. An oxide pattern 140 is delineated on the oxide film by photolithography technology and dry etching technology. Using the delineated oxide pattern 140 as an ion-implantation mask, n-type impurity ions such as nitrogen (N) are selectively implanted by multiple-energy ion implantation to reach the top of the drift layer 2 below the implanted layer 3p. Continuously using the oxide pattern 140 as an ion-implantation mask, p-type impurity ions such as aluminum (Al) is implanted by multiple-energy ion implantation in the implanted layer 3p so as to be connected on the portions of the drift layer 2 where n-type impurity ions have been implanted. As illustrated in FIG. 7, in the active area 101, the $n^+$-type local current spreading layers 22, 22a are selectively formed in the upper portion of the drift layer 2, and the $p^+$-type first embedded regions 4, 4a are selectively formed in the first spreading layer 3 in contact with the top surfaces of the local current spreading layers 22, 22a. In the outer-edge area 102, the $n^+$-type local current spreading layers 42a are selectively formed in the drift layer 2, and the $p^+$-type guard rings 44 are selectively formed in contact with the top surface of the respective local current spreading layers 42a.

Figure 8:
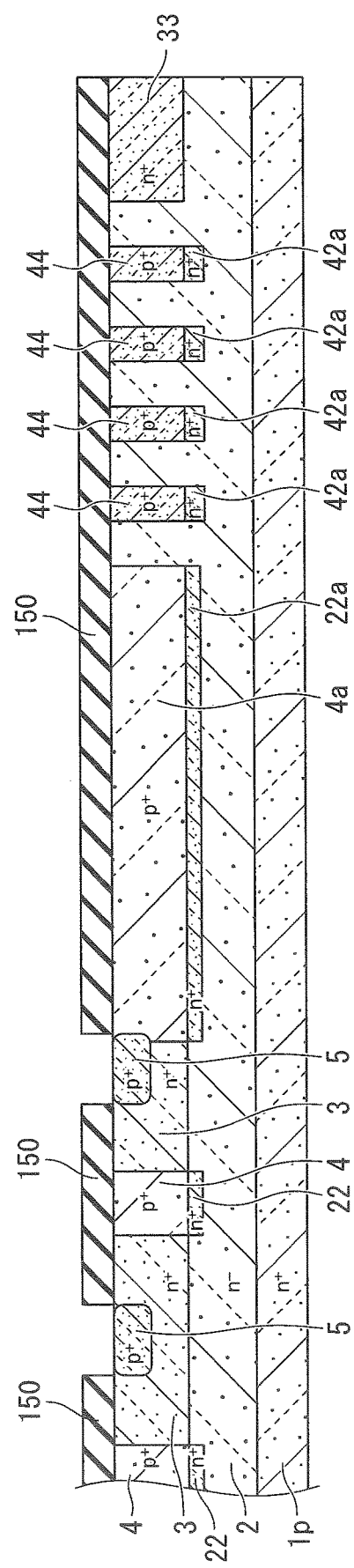
FIG. 8 is a schematic cross-sectional view illustrating an example of a process following FIG. 7 in the manufacturing method of the semiconductor device according to the embodiment of the present invention.

After removing the oxide pattern 140, a new oxide film is deposited on the top surfaces of the first spreading layer 3, the first embedded region 4, 4a, the guard rings 44 and the channel stopper 33, and an oxide pattern 150 is delineated on the oxide film by photolithography technology and dry etching technology. Using the delineated oxide pattern 150 as an ion-implantation mask, p-type impurity ions such as aluminum (Al) are selectively implanted into the first spreading layer 3 by multiple-energy ion implantation so as to separate from the first embedded region 4. As a result, as illustrated in FIG. 8, the $p^+$-type gate-bottom protection region 5 having a higher impurity concentration than the first embedded region 4 is selectively formed apart from the first embedded region 4. In the vicinity of the boundary between the active area 101 and the outer-edge area 102, the gate bottom protection region 5 is formed in contact with the first embedded region 4a. As illustrated in FIGS. 3 and 4, in the first spreading layer 3, the first embedded region 4 is formed by implanting the p-type impurity ions at a deeper level than the gate-bottom protection region 5. Consequently, the $n^+$-type local current spreading layer 22 having a higher impurity concentration than the p-type impurities distributed in the implanted region 4x is formed so as to overlap the implanted region 4x disposed beyond the bottom of the first embedded region 4. As a result, the p-type impurities distributed in the implanted region 4x are compensated by the n-type impurities in the local current spreading layer 22, and the minimum value of the curvature radius of the curvature circle Db at the bottom edge portion 4r on the first embedded region 4 can be made smaller than the minimum value of the curvature radius of the curvature circle Da at the bottom edge portion 5r on the gate bottom protection region 5. In addition, the $n^+$-type local current spreading layer 22 having a higher impurity concentration than the implanted region 4x may be formed after forming the first embedded region 4 and the implanted region 4x, to overlap the implanted region 4x.

Figure 9:
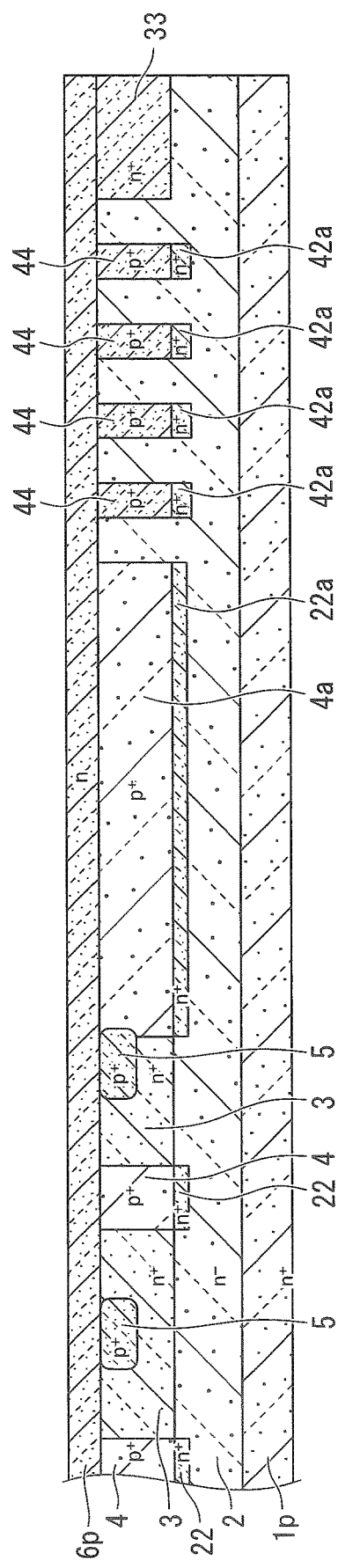
FIG. 9 is a schematic cross-sectional view illustrating an example of a process following FIG. 8 in the manufacturing method of the semiconductor device according to the embodiment of the present invention.
Figure 10:
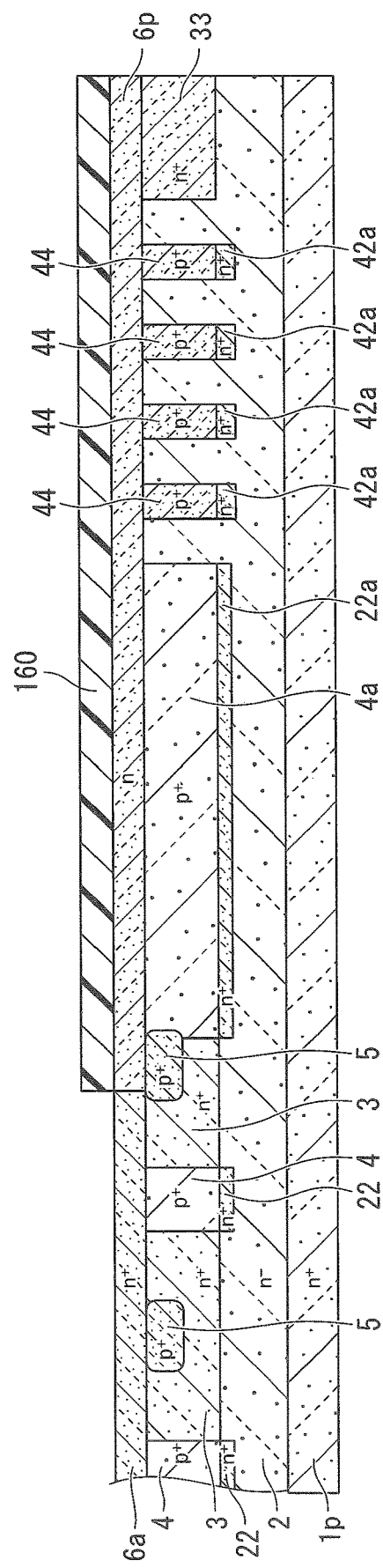
FIG. 10 is a schematic cross-sectional view illustrating an example of a process following FIG. 9 in the manufacturing method of the semiconductor device according to the embodiment of the present invention.

After removing the oxide pattern 150, an n-type epitaxial layer 6p is grown on top surfaces of the first spreading layer 3, the first embedded region 4, 4a, the gate-bottom protection region 5, the guard rings 44, the drift layer 2 and the channel stopper 33 as illustrated in FIG. 9. A top surface of the epitaxial layer 6p is coated with a photoresist film, and a photoresist pattern 160 is delineated on the photoresist film by photolithography technology and the like. Using the delineated photoresist pattern 160 as an ion-implantation mask, n-type impurity ions such as nitrogen (N) are selectively implanted in an upper portion of the epitaxial layer 6p by multiple-energy ion implantation from the upper side of the epitaxial layer 6p. As a result, an $n^+$-type implanted layer 6a is formed on top surfaces of the first spreading layer 3, the first embedded region 4, and the gate-bottom protection region 5, as illustrated in FIG. 10.

Figure 11:
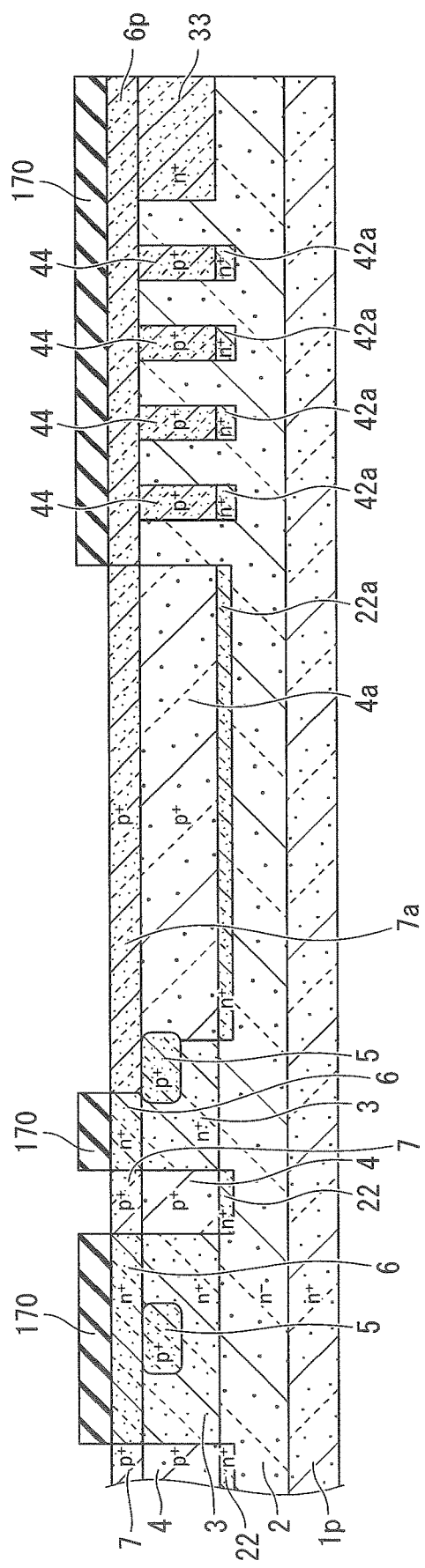
FIG. 11 is a schematic cross-sectional view illustrating an example of a process following FIG. 10 in the manufacturing method of the semiconductor device according to the embodiment of the present invention.

After removing the photoresist pattern 160, an oxide film is deposited on top surfaces of the implanted layer 6a and the epitaxial layer 6p, and an oxide pattern 170 is delineated on the oxide film by photolithography technology, dry etching technology and the like. Using the delineated oxide pattern 170 as an ion-implantation mask, p-type impurity ions such as aluminum (Al) are selectively implanted into the implanted layer 6a and the epitaxial layer 6p by multiple-energy ion implantation. As a result, as illustrated in FIG. 11, the $p^+$-type second embedded region 7 is selectively formed on the first embedded region 4 so as to sandwich the $n^+$-type second spreading layer 6. Then, the base-bottom embedded region (4, 7) provided with the first embedded region 4 and the second embedded region 7 is formed. In addition, the $p^+$-type second embedded region 7a is selectively formed on the first embedded region 4a and the gate-bottom protection region 5 in contact with the first embedded region 4a.

Figure 12:
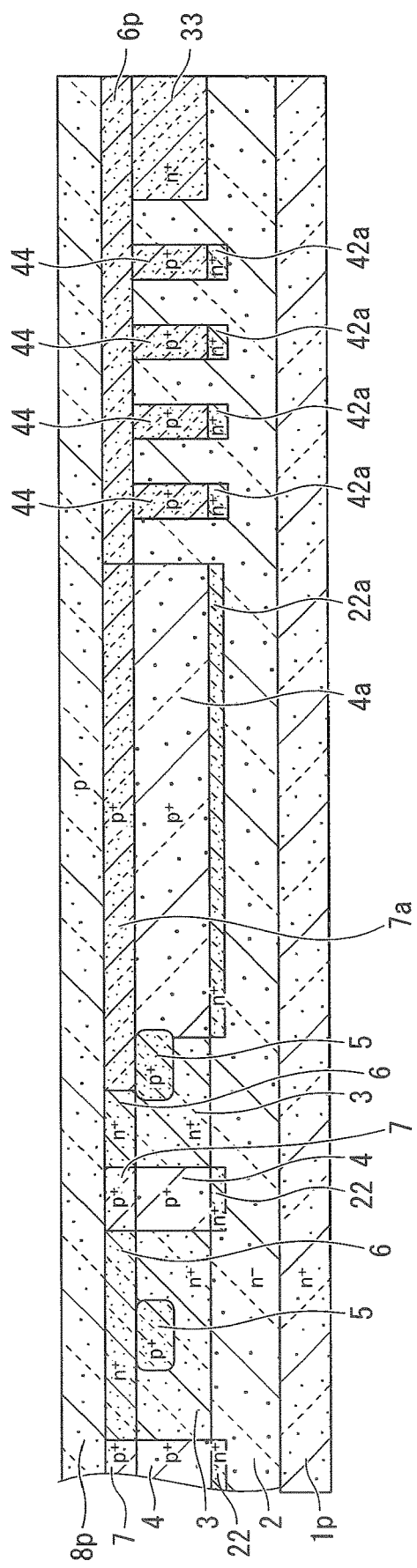
FIG. 12 is a schematic cross-sectional view illustrating an example of a process following FIG. 11 in the manufacturing method of the semiconductor device according to the embodiment of the present invention.
Figure 13:
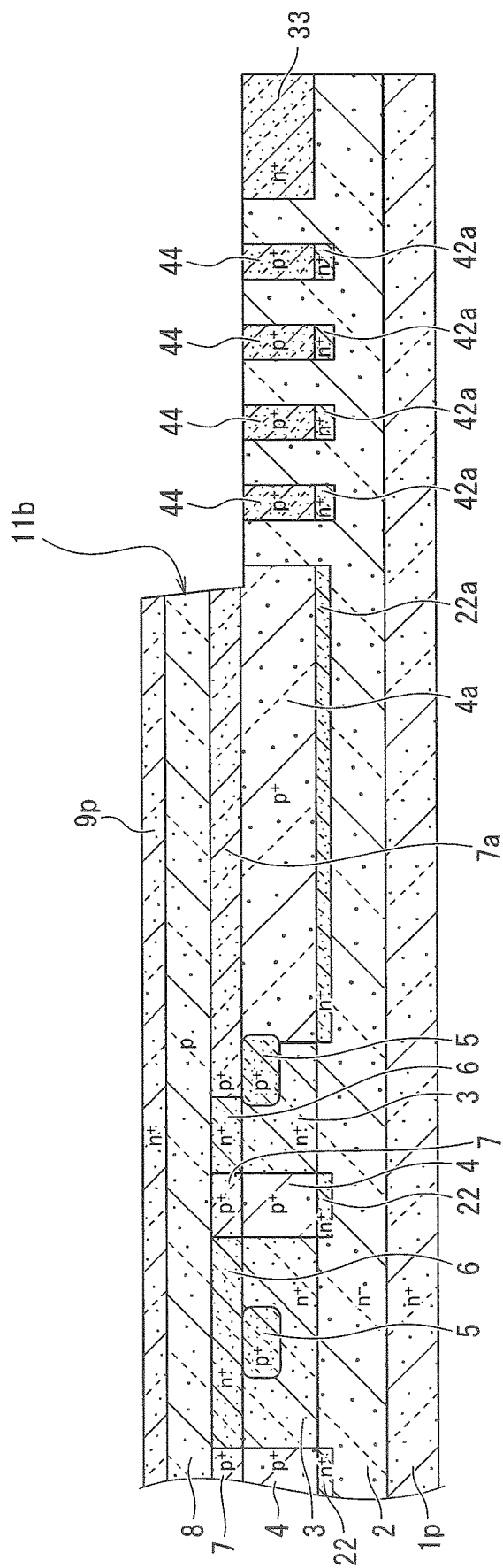
FIG. 13 is a schematic cross-sectional view illustrating an example of a process following FIG. 12 in the manufacturing method of the semiconductor device according to the embodiment of the present invention.

After removing the oxide pattern 170, a p-type epitaxial layer 8p is grown on top surfaces of the second embedded regions 7, 7a, the second spreading layer 6 and the epitaxial layer 6p as illustrated in FIG. 12. From an upper side of the epitaxial layer 8p, n-type impurity ions such as phosphorus (P) are implanted into the epitaxial layer 8p by multiple-energy ion implantation to form an n-type implanted layer on an upper portion of the epitaxial layer 8p. An oxide film is deposited on a top surface of the implanted layer formed on the upper portion of the epitaxial layer 8p by CVD technology and the like. A top surface of the oxide film is coated with a photoresist film, and an oxide pattern is delineated on the oxide film by photolithography technology, dry etching technology and the like. Using the delineated oxide pattern as an etching mask, the implanted layer on the epitaxial layer 8p, the epitaxial layer 8p and the epitaxial layer 6p are selectively etched by dry etching technology and the like. As a result, a mesa groove 11b is formed as illustrated in FIG. 13. In the active area 101 illustrated in FIG. 1, the implanted layer 9p, the base region 8 and the second embedded region 7a remain, and in the outer-edge area 102, the top surfaces of the guard rings 44 are exposed to a bottom surface of the mesa groove 11b.

Figure 14:
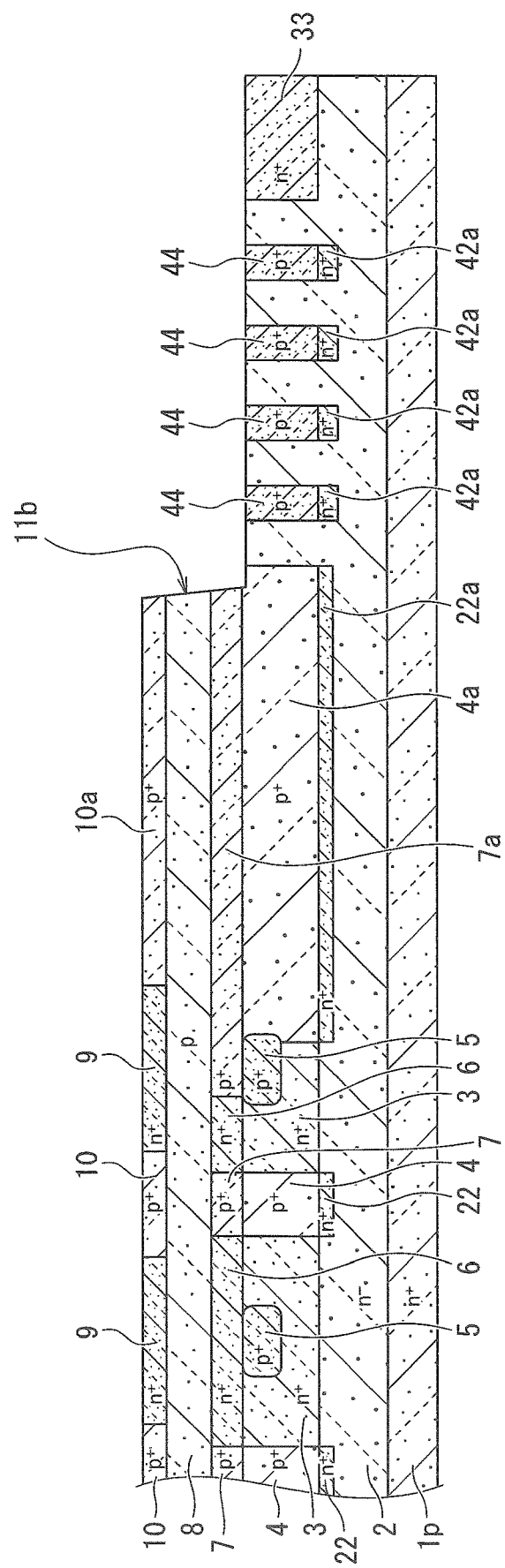
FIG. 14 is a schematic cross-sectional view illustrating an example of a process following FIG. 13 in the manufacturing method of the semiconductor device according to the embodiment of the present invention.

After removing the oxide pattern used as the etching mask, an oxide film is deposited on the top surface of the implanted layer 9p and the bottom surface of the mesa groove 11b by CVD technology and the like. A top surface of the oxide film is coated with a photoresist film, and an oxide pattern is delineated on the oxide film by photolithography technology, dry etching technology and the like. Using the delineated oxide pattern as an ion-implantation mask, p-type impurity ions, such as aluminum (Al) and the like, are selectively implanted into the implanted layer 9p from the upper side of the implanted layer 9p by multiple-energy ion implantation. As a result, as illustrated in FIG. 14, the source region 9 is formed above the gate-bottom protection region 5, and the $p^+$-type base contact regions 10, 10a in contact with the source region 9 are formed above the second embedded region 7, 7a.

Figure 15:
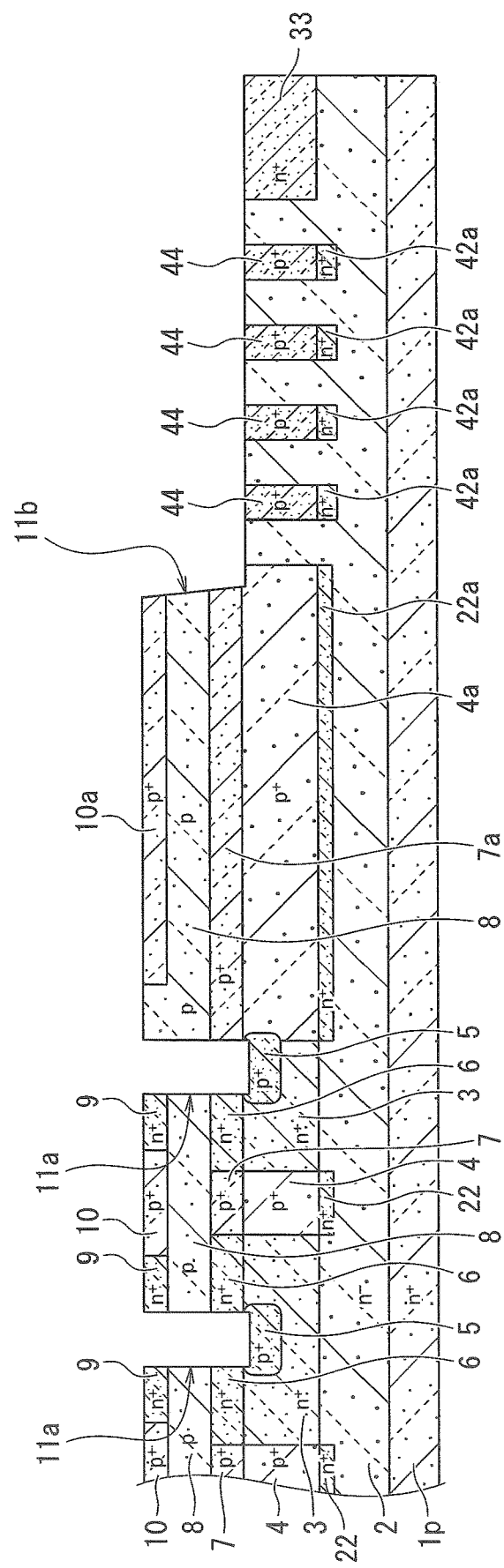
FIG. 15 is a schematic cross-sectional view illustrating an example of a process following FIG. 14 in the manufacturing method of the semiconductor device according to the embodiment of the present invention.

After removing the oxide pattern used as the ion-implantation mask, an oxide film is deposited on the top surfaces of the base contact regions 10, 10a and the source region 9, and the bottom surfaces of the mesa groove 11b by CVD technology and the like. A top surface of the oxide film is coated with a photoresist film, and an oxide pattern is delineated on the oxide film by photolithography technology, dry etching technology and the like. Using the delineated oxide pattern as an etching mask, the trench 11a is selectively formed by dry etching technology. As illustrated in FIG. 15, the trench 11a penetrates the source region 9, the base region 8 and the second spreading layer 6 to reach the gate-bottom protection region 5 formed in the first spreading layer 3. The $n^+$-type current spreading layer (3, 6) implemented by the first spreading layer 3 and the second spreading layer 6 is formed on the top surface of the drift layer 2.

Figure 16:
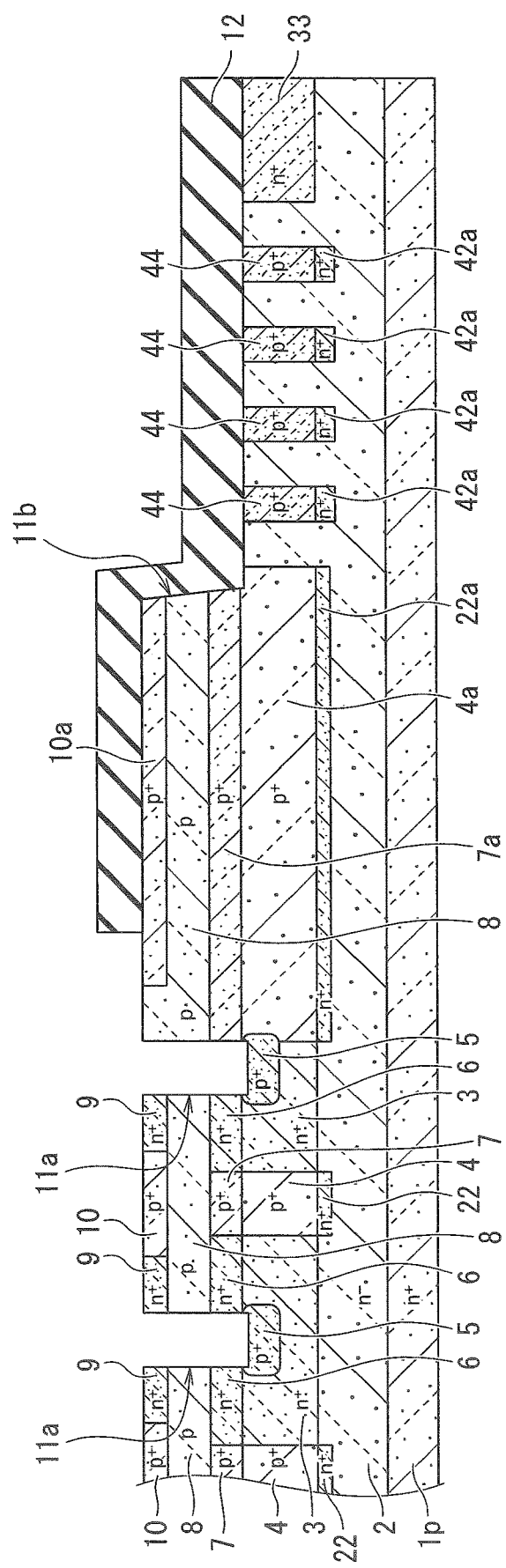
FIG. 16 is a schematic cross-sectional view illustrating an example of a process following FIG. 15 in the manufacturing method of the semiconductor device according to the embodiment of the present invention.

After removing the oxide pattern used as the etching mask, a carbon (C) film is deposited on an inner surface of the trench 11a by carbon sputtering technology and the like. Then, the implanted n-type impurity ions and the implanted p-type impurity ions are simultaneously activated by activation annealing. A field oxide film is deposited on an exposed surface after removing the carbon film by CVD technology and the like. Then, a top surface of the field oxide film is coated with a photoresist film, and a photoresist pattern is delineated on the photoresist film by photolithography technology and the like. Using the delineated photoresist pattern as an etching mask, the field oxide film is selectively etched. As a result, as illustrated in FIG. 16, a field oxide film 12 extending from the bottom surface and the sidewall of the mesa groove 11b to the top surface of the base contact region 10a is formed.

Figure 17:
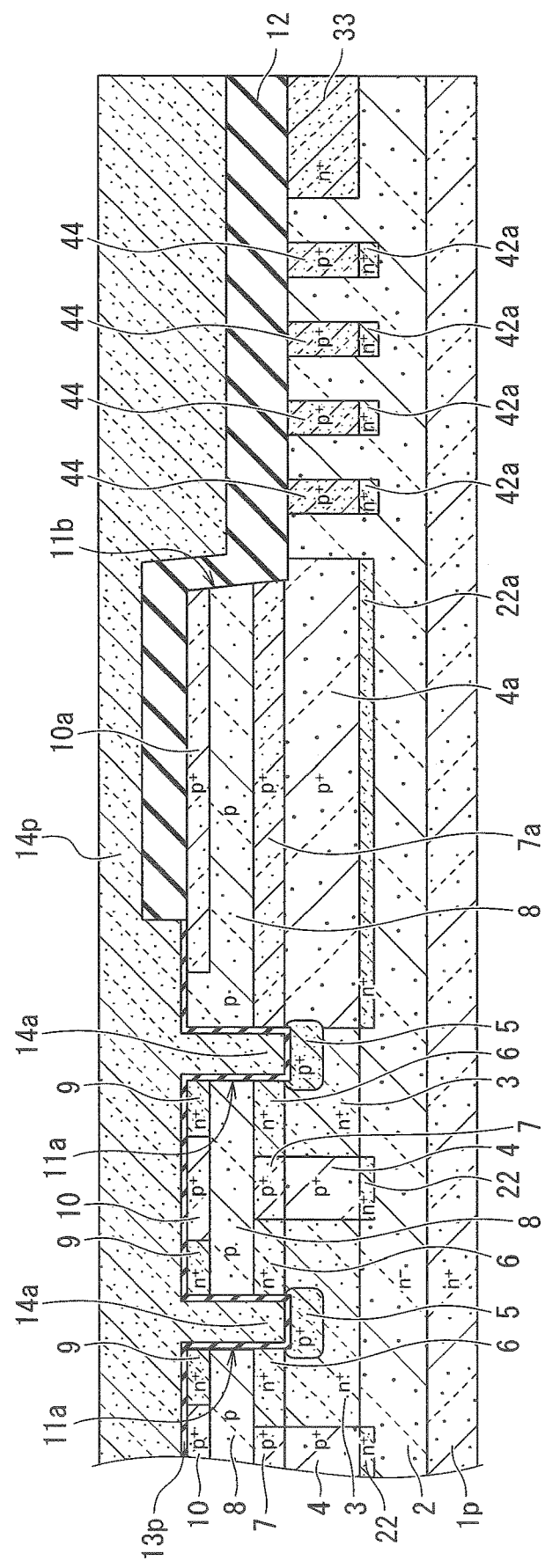
FIG. 17 is a schematic cross-sectional view illustrating an example of a process following FIG. 16 in the manufacturing method of the semiconductor device according to the embodiment of the present invention.

A gate insulating film 13p, such as a $SiO_2$ film and the like, is formed on the bottom surface and sidewall of the trench 11a, and on the top surfaces of the source region 9 and the base contact region 10, by thermal oxidation method, chemical vapor deposition (CVD) technology and the like. Then, as illustrated in FIG. 17, a polysilicon layer (a doped polysilicon layer) 14p in which impurities such as phosphorus (P) and boron (B) are doped at a high concentration is deposited so as to fill the trench 11a by CVD technology and the like.

Figure 18:
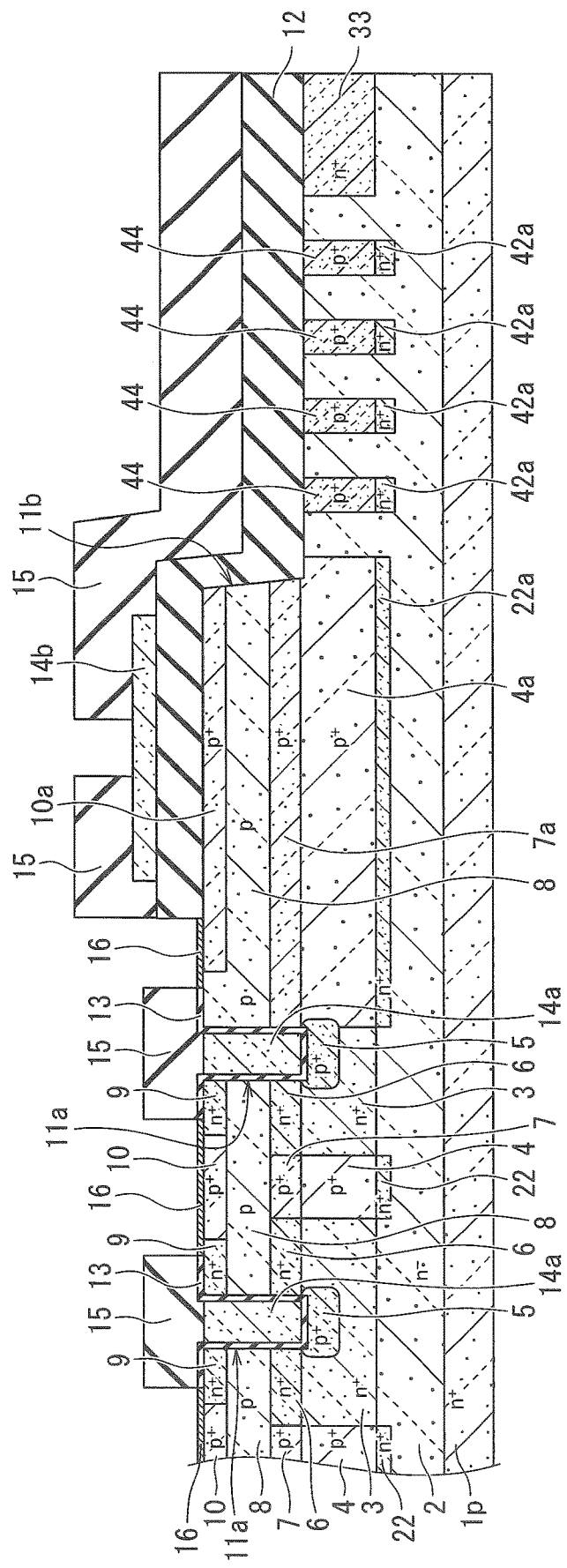
FIG. 18 is a schematic cross-sectional view illustrating an example of a process following FIG. 17 in the manufacturing method of the semiconductor device according to the embodiment of the present invention.

Thereafter, a part of the polysilicon layer 14p and a part of the gate insulating film 13p are selectively removed by photolithography technology and dry etching. Thus, as illustrated in FIG. 18, the insulated-gate electrode structure (13, 14a) is formed by delineating the gate insulating film 13 and the gate electrode 14a of the polysilicon layer. Then, an insulating film is deposited on a top surface of the insulated-gate electrode structure (13, 14a) provided with the gate electrode 14a and the gate insulating film 13 by CVD technology and the like. For the insulating film, borophospho silicate glass (BPSG), NSG and the like may be used. Then, a part of the deposited insulating film is selectively removed by photolithography technology, dry etching technology and the like. As a result, as illustrated in FIG. 18, the interlayer insulating film 15 in which a source-electrode contact-hole is opened is formed. Although not illustrated, a gate contact-hole is also opened in the interlayer insulating film 15 so as to expose a part of the gate surface electrode connected to the gate electrode 14a at a position different from the source electrode contact-hole.

A metal layer, such as a Ni film and the like, is deposited by sputtering method, evaporation method and the like, and a pattern is delineated on the metal layer by photolithography technology, RIE technology and the like. Then, a $NiSi_x$ film is formed by rapid thermal annealing (RTA) method, for example, at about 1000° C. Thereafter, the unreacted Ni film is removed to form the source contact layer 16 on the top surfaces of the source region 9 and the base contact region 10 as illustrated in FIG. 18. Then, a barrier metal layer (not illustrated), such as a Ti film, a TiN film and the like, and a metal layer, such as an Al film and the like, are deposited by sputtering method and the like. By delineating patterns on the barrier metal layer and the metal layer by photolithography technology, RIE technology and the like, as illustrating FIG. 2, the source electrode 18a, the gate electrode pad 18b and the gate surface electrode (not illustrated) are formed. As a result, a laminated structure of the barrier metal layer 17 and the source electrode 18a is formed so as to cover the source contact layer 16 and the interlayer insulating film 15. Further, the patterns of the source electrode 18a and the gate surface electrode are separated, and the gate electrode pad 18b providing a laminated structure with the barrier metal layer 17b is electrically connected to the gate electrode 14a via the interconnection layer 14b disposed on the field insulating film 12.

Further, the bottom surface of the substrate 1p is polished by chemical mechanical polishing (CMP) technology and the like to adjust the thickness, thereby forming the drain region 1. Thereafter, the drain electrode 19 made of Ti, Ni, Au and the like is deposited on the entire bottom surface of the drain region 1 by sputtering method, evaporation method and the like. Thus, the trench-gate semiconductor device illustrated in FIG. 2 is completed.

In the embodiment, as illustrated in FIGS. 3 and 4, the minimum value of the curvature radius of the curvature circle Da at the bottom edge portion 5r on the gate-bottom protection region 5 is formed larger than the minimum value of the curvature radius of the curvature circle Db at the bottom edge portion 4r on the first embedded region 4 in the base-bottom embedded region (4, 7). In addition, the bottom surface of the first embedded region 4 is formed at a level deeper than the bottom surface of the gate-bottom protection region 5 by a depth t. As a result, the electric field crowding on the gate-bottom protection region 5 can be mitigated by concentrating the electric field on the base-bottom embedded region (4, 7), and the avalanche breakdown can be avoided from occurring in the vicinity of the gate-bottom protection region 5.

OTHER EMBODIMENTS

While the insulated gate semiconductor device according to the embodiment of the present invention has been described, it should be understood that the present invention is not intended to be limited to the descriptions of the specification and the drawings implementing part of this disclosure. Various alternative embodiments, examples, and technical applications will be apparent to those skilled in the art according to this disclosure.

Although the semiconductor device using SiC is exemplified in the embodiment, the present invention can also be applied to a semiconductor device using another hexagonal wide band gap semiconductor, such as gallium nitride (GaN), diamond, aluminum nitride (AlN) and the like.

As described above, it should be noted that the present invention includes various embodiments, which are not disclosed herein, including elements optionally modified as alternatives to those illustrated in the above embodiments and modified examples. Therefore, the scope of the present invention is defined only by the technical features specifying the invention prescribed by the claims reasonably derived from the description heretofore.

What is claimed is:

1. A semiconductor device comprising:
a drift layer of a first conductivity type made of a hexagonal semiconductor having a wider bandgap than silicon;
a current spreading layer of the first conductivity type disposed on a top surface of the drift layer, having a higher impurity concentration than the drift layer;
a base region of a second conductivity type disposed on a top surface of the current spreading layer;
a gate-bottom protection region of the second conductivity type located in the current spreading layer, having a first bottom edge portion formed of a curved surface;
a base-bottom embedded region of the second conductivity type in contact with a bottom surface of the base region while being separated from the gate-bottom protection region in the current spreading layer, the base-bottom embedded region having a second bottom edge portion formed of a curved surface on a side surface facing the gate-bottom protection region; and an insulated-gate electrode structure provided in a trench penetrating the base region to reach the gate-bottom protection region, wherein in a cross section perpendicularly cut to an extending direction of the trench, a bottom surface of the base-bottom embedded region is placed deeper than a bottom surface of the gate-bottom protection region, and a minimum value of a curvature radius of the first bottom edge portion is larger than a minimum value of a curvature radius of the second bottom edge portion.

2. The semiconductor device of claim 1, wherein the gate-bottom protection region has a higher impurity concentration than the base-bottom embedded region.

3. The semiconductor device of claim 1, wherein the gate-bottom protection region has an impurity concentration of $3 \times 10^{18}$ cm$^{-3}$ or more and less than $1 \times 10^{19}$ cm$^{-3}$.

4. The semiconductor device of claim 1, wherein the base-bottom embedded region has an impurity concentration of $1 \times 10^{17}$ cm$^{-3}$ or more and less than $3 \times 10^{18}$ cm$^{-3}$.

5. The semiconductor device of claim 1, wherein the gate-bottom protection region has a top edge portion formed of a curved surface, and a minimum value of a curvature radius of the top edge portion is larger than the minimum value of the curvature radius of the second bottom edge portion.

6. The semiconductor device of claim 1, further comprising a local current spreading layer of the first conductivity type in contact with a bottom surface of the base-bottom embedded region, having a higher impurity concentration than the current spreading layer.

7. The semiconductor device of claim 1, further comprising a guard ring of the second conductivity type disposed around an active area where the insulated-gate electrode structure is provided, a bottom surface of the guard ring being located at the same depth level as the bottom surface of the base-bottom embedded region on the drift layer, and the guard ring has the same impurity concentration as the base-bottom embedded region.

8. The semiconductor device of claim 1, wherein the hexagonal semiconductor is silicon carbide.

* * * * *